(12) United States Patent
Gröger

(10) Patent No.: US 6,825,774 B1
(45) Date of Patent: Nov. 30, 2004

(54) DEVICE FOR INFLUENCING THE OPERATING STATUS OF AN ELECTRONIC APPLIANCE

(75) Inventor: Klaus-Erwin Gröger, Diekholzen (DE)

(73) Assignee: Robert Bosch GmbH, Stuttgart (DE)

(*) Notice: Subject to any disclaimer, the term of this patent is extended or adjusted under 35 U.S.C. 154(b) by 0 days.

(21) Appl. No.: 09/381,538

(22) PCT Filed: Apr. 2, 1998

(86) PCT No.: PCT/DE98/00303

§ 371 (c)(1),
(2), (4) Date: Sep. 21, 1999

(87) PCT Pub. No.: WO98/43209

PCT Pub. Date: Oct. 1, 1998

(30) Foreign Application Priority Data

Mar. 21, 1997 (DE) .......................... 197 11 788

(51) Int. Cl.$^7$ .............................................. G08C 19/00
(52) U.S. Cl. ............................ 340/825.72; 340/825.69; 340/10.1; 340/10.51; 340/426.13; 340/825.22; 340/825.24; 340/5.61; 455/39; 455/41.1; 455/41.2; 307/10.2
(58) Field of Search .............................. 340/10.1, 10.34, 340/10.51, 825.24, 825.69, 825.72, 5.61, 426, 825.22, 825.25, 5.62; 369/24.01; 307/10.2; 455/39, 41

(56) References Cited

U.S. PATENT DOCUMENTS

| | | | | |
|---|---|---|---|---|
| 4,728,949 A | * | 3/1988 | Platte et al. | 340/825.37 |
| 5,625,608 A | * | 4/1997 | Grewe et al. | 369/24.01 |
| 5,774,060 A | * | 6/1998 | Ostermann et al. | 340/5.61 |
| 5,790,043 A | * | 8/1998 | Hettich et al. | 340/5.62 |
| 5,838,074 A | * | 11/1998 | Loeffler et al. | 307/10.2 |
| 5,864,580 A | * | 1/1999 | Lowe et al. | 375/222 |
| 5,874,888 A | * | 2/1999 | Dunnebacke | 340/426 |
| 5,952,937 A | * | 9/1999 | Koopman et al. | 340/825.72 |
| 6,323,566 B1 | * | 11/2001 | Meier | 307/10.2 |

FOREIGN PATENT DOCUMENTS

| | | |
|---|---|---|
| DE | 35 44 370 | 6/1987 |
| DE | 295 14 056 | 12/1995 |
| EP | 0 744 627 | 11/1996 |
| FR | 2 615 306 | 11/1998 |

* cited by examiner

Primary Examiner—Ario Etienne
Assistant Examiner—Yves Dalencourt
(74) Attorney, Agent, or Firm—Kenyon & Kenyon

(57) ABSTRACT

An apparatus includes a moveable part and a transmission and reception device, for remote control of an electronic device, in particular of an entertainment electronic device, using a transponder. In order to initiate various functions, there are stored in a memory of the movable part in the form of a modulated transmitted signal that is analysed in the device in order to produce control signals.

5 Claims, 2 Drawing Sheets

DEVICE FOR INFLUENCING THE OPERATING STATUS OF AN ELECTRONIC APPLIANCE

BACKGROUND INFORMATION

The present invention is based on an apparatus for influencing the operating state of an electronic device using a transponder.

German Published Patent Application No. 295 14 056 describes device for protecting an audio device from unauthorized use in which, after removal of a movable part detachably joined to the audio device, operation of the audio device is interrupted and is not enabled again, after the movable part has been put back, until an access code that is accepted as authorized by the audio device is emitted from the transponder arranged for that purpose in the movable part.

Also known from the field of entertainment electronics, for the operation of, for example, television sets, video recorders, and audio systems, are infrared remote controllers with which at least a portion of the available functions of the relevant device can be remotely controlled.

SUMMARY OF THE INVENTION

The apparatus according to the present invention has the advantage that a movable part equipped with a transponder can be used not only as a simple theft protection system but also as a remote controller for controlling electronic devices.

The apparatus according to the present invention has the advantage, as compared to known infrared remote controllers, that because a transponder is used, batteries for supplying energy to the movable part are superfluous. This results in a reduction in the weight and volume of the movable part, and also eliminates the need to dispose of environmentally incompatible used batteries.

A further advantage of the proposed approach is that precise alignment of the movable part on the device-mounted receiver is not necessary, since, in contrast to known infrared remote controllers, the transfer of electromagnetic waves emitted by the movable part to the receiver functions even in the absence of visual contact.

In addition, the insensitivity of the apparatus to incident light prevents improper operation, as a consequence of stray incident light, of the device being operated.

It is furthermore advantageous that the oscillation exciting the transponder, and the transmitted signal of the transponder, are emitted in continuous alternation. In this fashion, the exciting oscillation and the transmitted signal can be transmitted on the same transmission frequency, so that the oscillating circuits in both the receiver and the transponder can be optimized for the transmission and reception of the electromagnetic oscillations on the same frequency.

In terms of the specifications applicable to the electromagnetic compatibility of electronic systems, it is advantageous to match the transmission frequency and transmission output to one another so that propagation of the oscillations which excite the transponder or are emitted by the transponder is confined to the premises in which the device to be operated is located.

The apparatus according to the present invention is explained below using the example of a car radio; it is not confined to that example, however, but rather is generally applicable to electronic devices in the field of entertainment electronics, for example television sets, video recorders, audio systems, and also to electronic devices in general.

Figure 1:
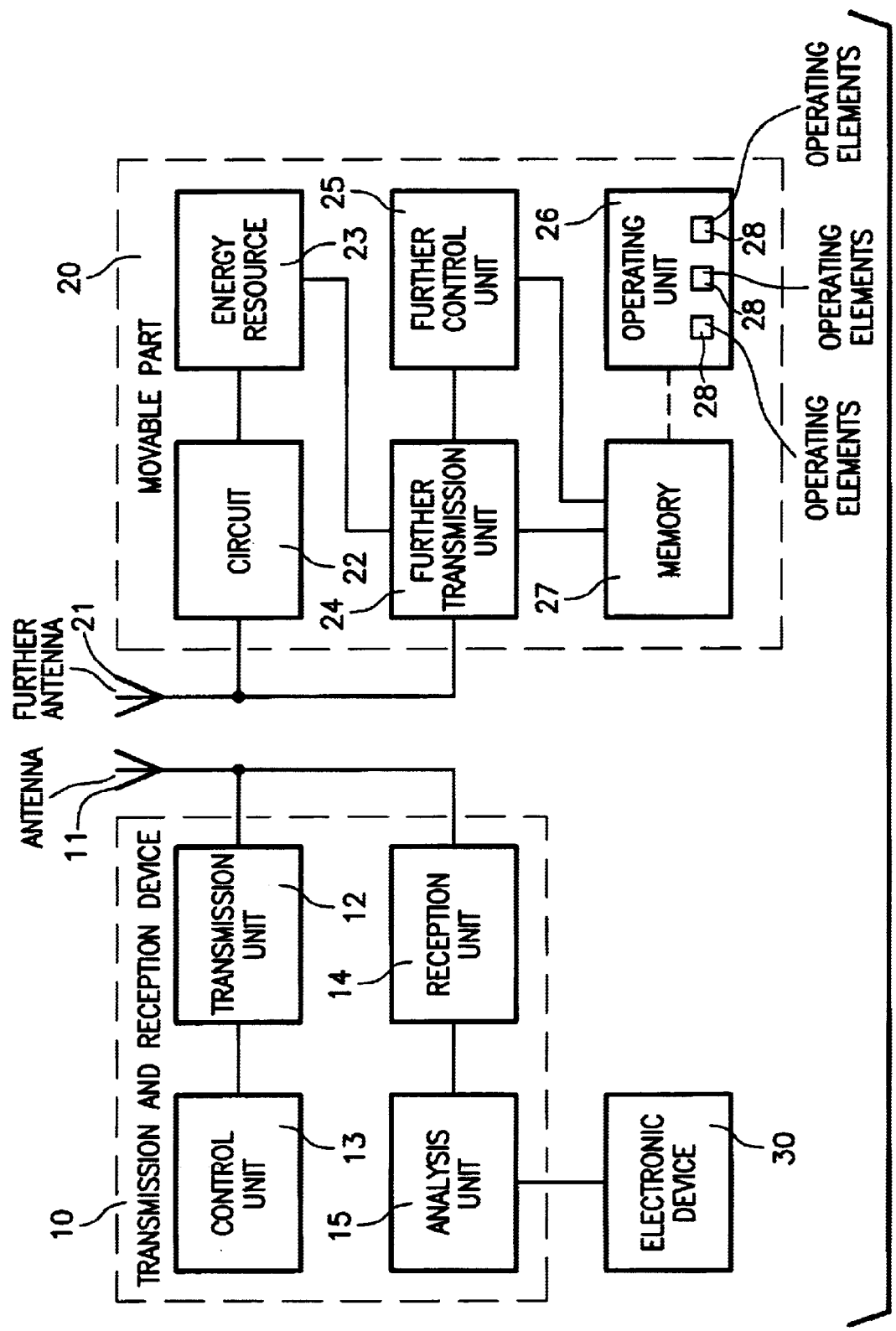
FIG. 1 shows a block diagram of an apparatus according to the present invention.

FIG. 1 depicts a block diagram of the apparatus according to the present invention, comprising a movable part 20 and a transmission and reception device 10 that in turn is connected to electronic device 30 that is to be influenced, in the present case a car radio.

Transmission and reception device 10 comprises a transmission unit 12 for producing a high-frequency electromagnetic oscillation for exciting elements 22–25 (collectively referred to as a transponder) that are arranged in moveable part 20 (hereinafter also referred to in abbreviated fashion as the excitation oscillation) that is emitted via the attached antenna 11. To control the transmission operations, transmission unit 12 is connected to a control unit 13.

Transmission and reception unit 10 furthermore comprises a reception unit 14, also connected to antenna 11, that receives the modulated electromagnetic oscillation emitted from the transponder for reception and demodulation (hereinafter referred to in abbreviated fashion as the transmitted signal). The demodulated received signal present at the output of reception unit 14 is delivered to an analysis unit 15 for allocation of the control instructions and functions with which electronic device 30 connected to transmission and reception unit 10 is controlled.

Movable part 20 comprises a further antenna 21, for receiving the excitation oscillation emitted by transmission and reception device 10, that is connected to a circuit 22 for recovering the energy contained in the excitation oscillation. Energy recovery circuit 22 is in turn connected to an energy reservoir 23.

Movable part 20 furthermore comprises an operating unit 26, comprising operating elements 28 such as, for example, pushbuttons, with which the codes produced in a code generator 27 can be selected. For that purpose, operating unit 26 is connected via a further control unit 25 to code generator 27. The codes produced in code generator 27 are delivered to a further transmission unit 24 for production of an electromagnetic oscillation that is modulated with the code delivered by code generator 27 and emitted via further antenna 21.

In the present case, code generator 27 comprises a memory in which a number of codes are stored. This memory can be addressed via operating elements of operating unit 26, so that specific codes can be selected as a function of the actuation of one or more operating elements 28 of operating unit 26.

In the present exemplary embodiment, provision is made for the oscillation emitted by further antenna 21 to be modulated directly with the code read out from the memory.

In a further exemplary embodiment, the code generator comprises an encryption algorithm with which the codes read out from the memory are encrypted, so that the transmitted signal of the transponder is modulated with an encrypted code.

To make available the energy necessary for production of the transmitted signal, further transmission unit 24 is connected to energy reservoir 23.

Figure 2:
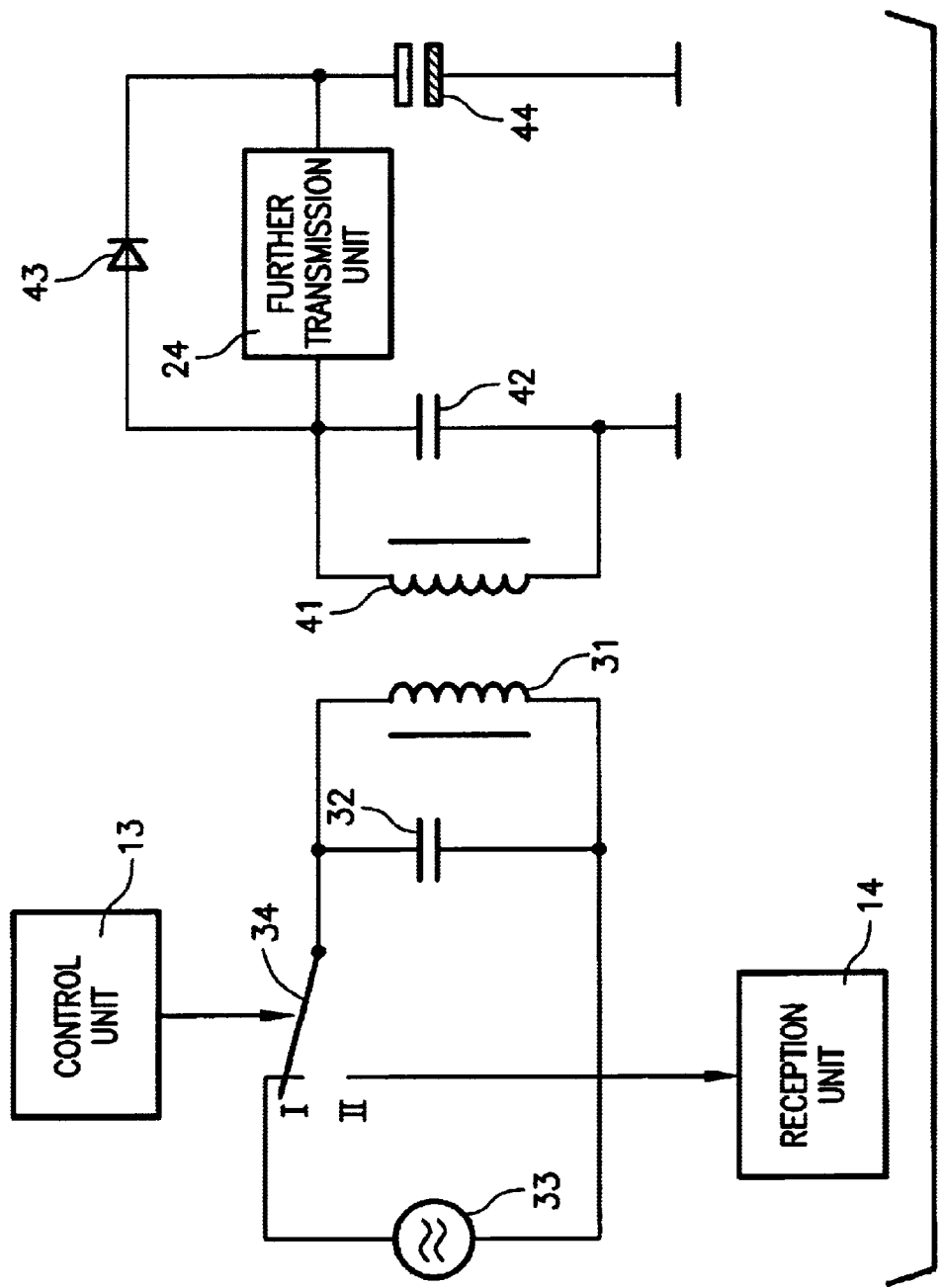
FIG. 2 shows an advantageous exemplary embodiment for carrying out the apparatus according to the present invention.

The manner of operation of the apparatus according to the present invention will be described below with reference to the exemplary embodiment depicted in FIG. 2 of the apparatus according to the present invention.

The interrogate control codes that are selected by the actuation of buttons on movable part 20, elements 22–25 (the transponder) of movable part 20 are energized by way of an excitation oscillation produced by read unit 10. To interrogate control codes that can be generated by the actuation of buttons on movable part 20, transmission unit 12 send to read unit 10, via antenna 11, an electromagnetic pulse (the so-called excitation oscillation) that lasts for a predefined period, in the present example approximately 50 ms. For this purpose, an oscillator 33 operating at a frequency of, for example, 125 kHz is connected for the duration of the excitation pulse (50 ms), via a switch 34 that is actuated by control unit 13 and is brought for this purpose into a first switch position 1, to a resonance oscillation circuit, comprising capacitor 32 and coil 31 acting as transmission antenna, whose resonant frequency is tuned to the frequency of oscillator 33.

The excitation oscillation emitted by read unit 10 is intercepted by further antenna 21 (in the form of a further coil 41), operating on the same frequency, of a further oscillation circuit of movable part 20 that comprises further coil 41 and further capacitor 42. For energy recovery, the received AC voltage signal is rectified by way of a diode 43 that functions as energy recovery circuit 22, and the energy resulting therefrom is stored in energy reservoir 23, configured in the present exemplary embodiment as a capacitor 44 with a high specific capacitance, i.e. with a high capacitance in terms of volume.

Once the excitation oscillation has decayed, data transfer begins from movable part 20 to transmission and reception device 10, i.e. movable part 20 emits, via further antenna 21, an oscillation modulated with a code selected via operating unit 26. For this purpose, by actuation of an operating element 28 on operating unit 26 (in the present case a button), the code associated with that button is read out from memory 27 and delivered to further transmission unit 24. In the simplest case, this is accomplished by the fact that a memory cell of memory 27 associated with a button is connected to transmission unit 24 via a pushbutton switch actuated by the button.

In the present exemplary embodiment, however, the association between actuation of an operating element 28 of operating unit 26 and a code stored in memory 27 is accomplished via further control unit 25.

In addition, further transmission unit 24 is activated via further control unit 25 of movable part 20, and the oscillation produced within transmission unit 24—at 125 kHz in the present exemplary embodiment—is modulated by a code read out from memory 27. In the present case, the type of modulation utilized is frequency modulation, the transmission frequency being shifted between the fundamental frequency of 125 kHz and 130 kHz by way of the code, which is present in binary form. In principle, however, other types of modulation such as phase modulation and amplitude modulation, and other frequencies, are also usable.

The energy necessary for production of the modulated transmitted signal is taken from energy reservoir 23. The modulated transmitted signal produced by transmission unit 24 is delivered to further oscillating circuit 41, 42 and emitted via coil 41.

In addition to the functions described, further control unit 25 of movable part 20 has the task of confining emission or production of the transmitted signal to the time frames necessary for transfer the selected code. This ensures that only the code being transferred is emitted during the transfer time period.

The transmitted signal emitted from movable part 20 is received by antenna 11 of transmission and reception device 10 and conveyed via controllable switch 34, which in a second switch position creates a connection between oscillating circuit 31, 32 and reception unit 14, to reception unit 14 of transmission and reception device 10. By demodulation of the received transmitted signal, the transferred code is isolated in reception unit 14 and is associated in analysis unit 15 with a control instruction for controlling the attached electronic device 30.

In the present exemplary embodiment, provision is made for the oscillation that excites the transponder of movable part 20 and the transmitted signal emitted from movable part 20 to be transferred on the same frequency of, for example, 125 kHz. This requires that transmission of the excitation oscillation by transmission and reception device 10, and of the transmitted signal by movable part 20, be accomplished in continuous alternation.

The rhythm with which emission of the excitation oscillation and the transmitted signal occurs is defined by controller 13 of transmission and reception device 10. For example, switch 34 is held by controller 13 in its first switch position for a predefined time period of, for example, 50 ms, so that for that time period an excitation oscillation is emitted. Once the predefined time period has elapsed, switch 34 is brought by controller 13 into a second switch position, so that now antenna 11 of transmission and reception device 10 is connected to reception unit 14. During the time segment following the switchover of switch 34 into the second switch position, the transmitted signal is emitted from movable part 20.

Synchronization between further transmission unit 24 in the movable part and the switchover of switch 34 is accomplished by determining the movable-part antenna voltage in further control unit 25. A decrease in the antenna voltage after the excitation oscillation has been received indicates that switch 34 in transmission and reception device 10 has been switched over and that the transmission and reception device 10, is now ready to receive, and is used to initiate the transmission operation at the movable-part end, Once a time span sufficient for emission of a transmitted signal (in the present case 20 ms) has elapsed, further transmission unit 24 of movable part 20 is switched off and the transmission operation is thus terminated.

Once the predefined transmission period, which is known in controller 13 of the transmission and reception device 10, has elapsed, switch 34 is brought back into the first switch position and another excitation oscillation is emitted.

What is claimed is:

1. An arrangement for influencing an operating state of an electronic device, comprising:
   at least one operating unit;
   a movable part for operating the electronic device and on which the at least one operating unit is arranged, the movable part including:
   a transponder, and
   a code generator;
   and
   a transmission and reception device connected to the electronic device and including:
   a transmission unit for emitting an electromagnetic oscillation for exciting the transponder, a reception unit for receiving and demodulating a modulated electromagnetic oscillation emitted from the transponder, and an analysis unit for converting the demodulated electromagnetic oscillation emitted from the transponder into control instructions for influencing the operating state of the electronic device, wherein:

the code generator generates a plurality of codes to be selected via the at least one operating unit in order to modulate the electromagnetic oscillation emitted from the transponder, and a plurality of further operating states of the electronic device is initiated by a selection of the plurality of codes.

2. The arrangement according to claim 1, wherein a radiation of the electromagnetic oscillation for exciting the transponder and a radiation of the electromagnetic oscillation emitted from the transponder are provided in a continuous alternation.

3. The arrangement according to claim 1, wherein a range of the electromagnetic oscillation emitted from the transmission unit and a range of the electromagnetic oscillation emitted from the transponder are confined to a predefined circumference around the transmission and reception device and the movable part that is necessary for an operation of the electronic device.

4. The arrangement according to claim 1, wherein the at least one operating unit includes a plurality of operating elements.

5. An apparatus for controlling an electronic device comprising:

at least one operating unit;

a movable part on which is arranged the at least one operating unit and including:
 a transponder, and
 a code generator for generating a plurality of codes to be selected via the at least one operating unit in order to modulate an electromagnetic oscillation emitted from the transponder; and a further control unit for limiting one of a production and an emission of the transmitted modulated electromagnetic oscillation to a time necessary for a transfer of a selected one of the plurality of codes.

* * * * *

UNITED STATES PATENT AND TRADEMARK OFFICE
CERTIFICATE OF CORRECTION

PATENT NO. : 6,825,774 B1
DATED : November 30, 2004
INVENTOR(S) : Klaus-Erwin Gröger It is certified that error appears in the above-identified patent and that said Letters Patent is hereby corrected as shown below:

Column 2,
Insert between lines 3-4, -- DETAILED DESCRIPTION --.

Column 4,
Line 45, change "part end, Once" to -- part end. Once --.

Signed and Sealed this

Sixteenth Day of August, 2005

JON W. DUDAS
*Director of the United States Patent and Trademark Office*